United States Patent
Shibata et al.

(10) Patent No.: US 9,692,412 B2
(45) Date of Patent: Jun. 27, 2017

(54) SURFACE PROTECTIVE SHEET, ELECTRONIC DEVICE, AND METHOD FOR MANUFACTURING ELECTRONIC DEVICE COMPONENT

(71) Applicant: KIMOTO CO., LTD., Saitama (JP)

(72) Inventors: Yutaka Shibata, Saitama (JP); Hikaru Nishinaga, Saitama (JP)

(73) Assignee: KIMOTO CO., LTD., Saitama (JP)

( * ) Notice: Subject to any disclaimer, the term of this patent is extended or adjusted under 35 U.S.C. 154(b) by 88 days.

(21) Appl. No.: 14/379,556

(22) PCT Filed: Feb. 25, 2013

(86) PCT No.: PCT/JP2013/054825
§ 371 (c)(1),
(2) Date: Aug. 19, 2014

(87) PCT Pub. No.: WO2013/129339
PCT Pub. Date: Sep. 6, 2013

(65) Prior Publication Data
US 2015/0044481 A1  Feb. 12, 2015

(30) Foreign Application Priority Data
Mar. 1, 2012 (JP) .................................. 2012-044918

(51) Int. Cl.
*H03K 17/96* (2006.01)
*C09D 175/08* (2006.01)
(Continued)

(52) U.S. Cl.
CPC ....... *H03K 17/962* (2013.01); *B29C 63/0017* (2013.01); *B29C 65/70* (2013.01);
(Continued)

(58) Field of Classification Search
CPC . B29C 63/0017; B29C 65/70; B29K 2101/00; B29L 2031/3475; B32B 2250/02;
(Continued)

(56) References Cited

U.S. PATENT DOCUMENTS

2004/0110895 A1* 6/2004 Anderson et al. ............ 524/588
2005/0238879 A1* 10/2005 Shoshi et al. ................. 428/412
(Continued)

FOREIGN PATENT DOCUMENTS

JP         6-287470 A    10/1994
JP         2006-169440 A  6/2006
(Continued)

OTHER PUBLICATIONS

International Search Report for PCT/JP2013/054825 dated May 28, 2013.

*Primary Examiner* — Thao T Tran
(74) *Attorney, Agent, or Firm* — Kenealy Vaidya LLP (57) ABSTRACT

Provided is a surface protective sheet whereby antifouling properties are enhanced and excellent wiping properties and sliding properties are ensured, the present invention is a surface protective sheet (1) having a protective film (3) on a surface of a substrate (2). The protective film (3) is configured from a cured product of a curable composition, the curable composition includes a coating material and a curable resin. The coating material is configured from a reaction product of at least compounds A, B, C and D. Compound A is an acrylic polymer having a hydroxyl group in a side chain thereof, compound B is a diisocyanate, compound C is a polyether polyol, and compound D is a photopolymerizable compound having both a hydroxyl group and a photopolymerizable group. The content of the coating material and the curable resin in the curable composition is preferably 2 parts by mass or more and 40 parts by mass or less of the coating material and 60 parts by mass
(Continued)

or more and 98 parts by mass or less of the curable resin when the total amount of the coating material and the curable resin is 100 parts by mass.

20 Claims, 4 Drawing Sheets (51) Int. Cl.
| | |
|---|---|
| B29C 65/70 | (2006.01) |
| B32B 27/40 | (2006.01) |
| B32B 38/10 | (2006.01) |
| C08G 18/48 | (2006.01) |
| C08G 18/62 | (2006.01) |
| C08G 18/67 | (2006.01) |
| C09D 175/04 | (2006.01) |
| B29C 63/00 | (2006.01) |
| C09J 175/04 | (2006.01) |
| B29K 101/00 | (2006.01) |
| B29L 31/34 | (2006.01) |
| C08G 101/00 | (2006.01) |

(52) U.S. Cl.
CPC .............. *B32B 27/40* (2013.01); *B32B 38/10* (2013.01); *C08G 18/485* (2013.01); *C08G 18/6229* (2013.01); *C08G 18/6254* (2013.01); *C08G 18/673* (2013.01); *C09D 175/04* (2013.01); *C09D 175/08* (2013.01); *C09J 175/04* (2013.01); B29K 2101/00 (2013.01); B29L 2031/3475 (2013.01); B32B 2250/02 (2013.01); B32B 2255/10 (2013.01); B32B 2255/26 (2013.01); B32B 2367/00 (2013.01); B32B 2375/00 (2013.01); B32B 2457/208 (2013.01); C08G 2101/00 (2013.01); H03K 2217/960765 (2013.01); Y10T 428/31565 (2015.04)

(58) Field of Classification Search
CPC ............ B32B 2255/10; B32B 2255/26; B32B 2367/00; B32B 2375/00; B32B 2457/208; B32B 27/40; B32B 38/10; C08G 18/485; C08G 18/6229; C08G 18/673; C08G 2101/00; C09D 175/04; C09D 175/08; C09J 175/04; H03K 17/962; H03K 2217/960765; Y10T 428/31565
USPC ....... 428/423.7; 156/230; 264/256; 524/507; 200/600
See application file for complete search history.

(56) References Cited

U.S. PATENT DOCUMENTS

| | | |
|---|---|---|
| 2008/0160187 A1 | 7/2008 | Murata et al. |
| 2009/0029160 A1* | 1/2009 | Takamatsu ................ B32B 7/12 428/355 AC |
| 2010/0035053 A1 | 2/2010 | Kishi et al. |
| 2011/0183120 A1* | 7/2011 | Sharygin et al. ............. 428/174 |
| 2012/0107605 A1 | 5/2012 | Ozawa et al. |
| 2012/0252998 A1 | 10/2012 | Suda et al. |

FOREIGN PATENT DOCUMENTS

| | | |
|---|---|---|
| JP | 2008-255301 A | 10/2008 |
| JP | 2010-17991 A | 1/2010 |
| JP | 2010-95707 A | 4/2010 |
| JP | 2010-128363 A | 6/2010 |
| JP | 2011-46084 A | 3/2011 |
| JP | 2011-190357 A | 9/2011 |
| JP | 2011-224956 A | 11/2011 |
| WO | 2009/090803 A1 | 7/2009 |
| WO | 20101090116 A1 | 8/2010 |
| WO | 2011/013497 A1 | 2/2011 |
| WO | 2011/034035 A1 | 3/2011 |

* cited by examiner

SURFACE PROTECTIVE SHEET, ELECTRONIC DEVICE, AND METHOD FOR MANUFACTURING ELECTRONIC DEVICE COMPONENT

TECHNICAL FIELD

The present invention relates to a surface protective sheet, electronic device provided with the surface protective sheet and a method of manufacturing a component composing an electronic device (electronic device component), etc.

BACKGROUND ART

A variety of optical members, such as a touch panel, display panel, lens and glass, easily become dirty with fingerprints, etc., and the visibility is deteriorated due to attached dirt. Therefore, there have been demands for providing properties of suppressing dirt attachment (antifouling properties) to make fingerprint dirt, etc. less noticeable and improving easiness of wiping off attached dirt (wiping properties). In recent years, as to optical members used for touch panels, etc., there are demands for further providing easy-sliding quality on surfaces (sliding properties) to enhance operability, as well.

As a method of responding to those demands, for example, providing antifouling properties, wiping properties and sliding properties by laminating a film on a surface of an optical member has been known (patent documents 1 and 2).

The patent document 1 describes a hard coat film, wherein a hard coat layer obtained by drying and curing an application liquid containing urethane acrylate, a photo-radical polymerization initiator, fluorine-based additive and solvent is laminated on a substrate surface.

The patent document 2 describes a laminated body, wherein a hard coat layer obtained by drying and curing an application liquid containing an isocyanuric acid triacrylate of an ethylene oxide and an s-caprolactone adduct, a photopolymerization initiator and propylene glycol monomethyl ether is laminated on a substrate surface.

RELATED ART DOCUMENTS

Patent Documents

Patent Document 1: Japanese Patent Unexamined Publication (KOKAI) No. 2010-017991
Patent Document 2: WO2009/090803

SUMMARY OF THE DISCLOSED SUBJECT MATTER

The hard coat film of the patent document 1 has excellent sliding properties, however, has disadvantages that fingerprints and other dirt are noticeable (poor in antifouling properties) and wiping properties were also poor.

As to the laminated body of the patent document 2, dirt is less noticeable (being excellent in antifouling properties) and wiping properties were excellent, however, sliding properties were not enough. Therefore, operability was insufficient when used for optical members of electronic devices, etc.

According to one aspect of the present invention, there is provided a surface protective sheet, wherein antifouling properties are improved and excellent wiping properties and sliding properties are ensured. According to another aspect, there is provided an electronic device provided with a surface protective sheet as such. According to still other aspect, there is provided a component composing an electronic device provided with a protective film, wherein antifouling properties are improved and excellent wiping properties and sliding properties are ensured, and a method of manufacturing the same.

Present inventors found that antifouling properties of a protective film can be improved and excellent wiping properties and sliding properties can be ensured when configuring the protective film with a cured product of a curable composition having a specific composition including a curable resin and a coating material having a specific composition and completed the present invention.

A surface protective sheet of the present invention has a protective film on a surface of a substrate, wherein the protective film is configured from a cured product of a curable composition, the curable composition includes a coating material and a curable resin, and the coating material is configured from a reaction product of at least compounds A, B, C and D.

In the present invention, compound A is an acrylic polymer having a hydroxyl group in a side chain thereof, compound B is a diisocyanate, compound C is a polyether polyol, and compound D is a photopolymerizable compound having both a hydroxyl group and a photopolymerizable group.

An electronic device of the present invention is configured that an electronic device body is provided with the surface protective sheet of the present invention with a substrate side thereof facing thereto.

An electronic device component of the present invention has a protective film of the present invention on a surface of a component body thereof composing an electronic device.

In the electronic device component of the present invention, the surface protective sheet of the present invention is formed integrally on a surface of a component body composing an electronic device.

A method of manufacturing an electronic device component of the present invention is to bring the surface protective sheet of the present invention contact with a component body composing an electronic device in a way that a protective film of the surface protective sheet faces thereto and, subsequently, to remove a substrate of the surface protective sheet so as to form a protective film on a surface of the component body.

A method of manufacturing an electronic device component of the present invention is to integrally mold a material of a component body composing an electronic device and the surface protective sheet of the present invention so as to form a protective film on a surface of the component body.

The present invention includes the following modes.

(1) A content in a curable composition may be 2 parts by mass or more and 40 parts by mass or less of a coating material and 60 parts by mass or more and 98 parts by mass or less of a curable resin when the total amount of the coating material and curable resin is 100 parts by mass.

(2) The coating material may be a reaction product of at least compounds A, B, C and D. Therefore, it may be also configured from a reaction product of components A, B, C and D1. Here, compound D1 is a photopolymerization compound not having any hydroxyl group but has a photopolymerizable group.

(3) As a curable resin, an ionizing radiation curable resin may be used.

(4) In the electronic device of the present invention, an electrostatic capacitance type touch panel may be used as an electronic device body. As an electronic device component, for example, a chassis of a touch pane may be mentioned.

According to the present invention, since the protective film is configured from a cured product of a curable composition having a specific composition including a curable resin and a coating material having a specific composition, a surface protective sheet having improved antifouling properties and excellent wiping properties and sliding properties ensured, an electronic device and an electronic device component can be provided.

According to the method of manufacturing an electronic device component of the present invention, it is possible to provide an electronic device component having a protective film with improved antifouling properties and excellent wiping properties and sliding properties ensured.

DESCRIPTION OF NUMERICAL NOTATIONS

1 . . . surface protective sheet, 2 . . . substrate, 3 . . . protective film, 4 . . . electronic device body, 4a . . . electronic device, 5 . . . component body composing electronic device, 6 . . . component composing electronic device

EXEMPLARY MODE FOR CARRYING OUT THE DISCLOSED SUBJECT MATTER

Figure 1:
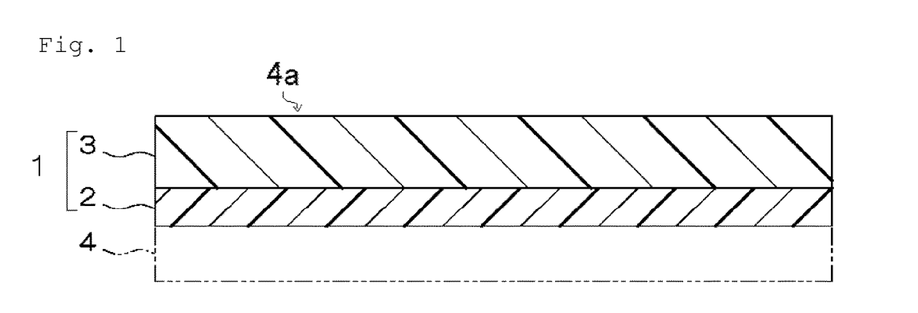
FIG. 1 is a sectional view showing an example of a surface protective sheet of the present invention.

First, an example of a surface protective sheet of the present invention will be explained. As shown in FIG. 1, a surface protective sheet 1 of the present example is configured by laminating a protective film 3 on a substrate 2.

The substrate 2 is not particularly limited and a variety of well-known substrates, for example, in a film shape, a sheet shape and a plate shape, etc. may be mentioned. Also, a surface of the substrate 2 may be, for example, flat or an uneven shape. Furthermore, the substrate 2 may be a stereoscopic shape having a three-dimensional curved surface. As a substrate 2 as such, specifically, for example, a glass plate and other hard substrates, for example, a resin substrate and other flexible substrates, etc. may be mentioned, and a flexible substrate is preferably mentioned.

A resin in a resin substrate is not particularly limited and when the substrate 2 is a film-shaped substrate, for example, acryl, polycarbonate, polyvinyl chloride, polyester, polypropylene, polyethylene, acetyl cellulose, cycloolefin, etc. may be mentioned. When the substrate 2 is a plate-shaped substrate, for example, acryl, polycarbonate and polyvinyl chloride, etc. may be mentioned. These resins may be used alone or in combination of two or more kinds. As the substrate 2, a transparent substrate is preferably mentioned and, specifically, a glass substrate and a resin substrate formed by polyester may be mentioned. A thickness of the substrate 2 (when it is an uneven shape, the maximum thickness) is, for example, 4 μm to 10 mm, preferably 25 μm to 500 μm and furthermore preferably 38 μm to 250 μm.

A surface of the substrate 2 may be subjected to an easy adhesion treatment for the purpose of improving adhesiveness to the protective film 3 when needed. For example, well-known methods, such as a plasma treatment, corona discharge treatment, ultraviolet ray irradiation treatment and formation of an undercoat easily adhesive layer, may be mentioned as the easy adhesion treatment.

The protective film 3 of the present example is configured from a cured product of a curable composition. The curable composition in this example includes a coating material and a curable resin.

The coating material in this example is configured from a reaction product of at least a compound A, compound B, compound C and compound D. In this example, compound A is an acrylic polymer, compound B is a diisocyanate, compound C is a polyether polyol and compound D is a photopolymerizable compound having both a hydroxyl group and a photopolymerizable group.

Compound A (an acrylic polymer having a hydroxyl group in a side chain thereof) is configured from a polymeric substance of a monomeric composition. The monomeric composition in this example includes a (meth)acrylic acid alkyl ester as a main component and furthermore includes a hydroxyl group-containing vinyl monomer copolymerizable with a (meth)acrylic acid alkyl ester.

As a (meth)acrylic acid alkyl ester, methacrylic acid alkyl ester and/or acrylic acid alkyl ester, such as methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, 2-ethylhexyl (meth)acrylate, nonyl (meth)acrylate, decyl (meth)acrylate, benzyl (meth)acrylate and dicyclopentadienyl (meth)acrylate, may be mentioned. Those (meth)acrylic acid alkyl esters may be used alone or in combination of two or more kinds.

As a (meth)acrylic acid alkyl ester, preferably methyl (meth)acrylate and butyl (meth)acrylate may be mentioned, more preferably methyl (meth)acrylate may be mentioned and particularly preferably methyl methacrylate (MMA) may be mentioned.

A mixing ratio of a (meth)acrylic acid alkyl ester is, with respect to the total amount of a monomer composition, for example, 40 mass % or more, preferably 50 mass % or more, more preferably 60 mass % or more, particularly preferably 70 mass % or more and normally less than 100 mass %.

When the mixing ratio of a (meth)acrylic acid alkyl ester (particularly methyl (meth)acrylate) is within the range above, a glass transition temperature of compound A can be set high and excellent sliding properties can be ensured on a coating surface obtained by using a coating material.

As a hydroxyl group-containing vinyl monomer, (meth)acrylic acid alkyl ester containing a hydroxyl group and specifically, for example, 2-hydroxy ethyl (meth)acrylate, 2-hydroxy propyl (meth)acrylate, 3-hydroxy propyl (meth) acrylate, 2-hydroxy butyl (meth)acrylate, 4-hydroxy butyl (meth)acrylate, 6-hydroxy hexyl (meth)acrylate, 8-hydroxy octyl (meth)acrylate, 10-hydroxydecyl (meth)acrylate, 12-hydroxy lauryl (meth)acrylate, 4-hydroxy methylcyclohexyl (meth)acrylate and N-hydroxymethylamide (meth) acrylate, etc. may be mentioned. Those hydroxyl group-containing monomers may be used alone or in combination of 2 or more kinds.

As a hydroxyl group-containing vinyl monomer, preferably 2-hydroxyethyl (meth)acrylate and more preferably 2-hydroxyethyl (meth)acrylate (2-HEA) may be mentioned.

A mixing ratio of a hydroxyl group-containing vinyl monomer is, with respect to the total amount of a monomer composition, for example, 50 mass % or less, preferably 40 mass % or less and normally 5 mass % or more.

The monomer composition in this example may further contain (meth)acrylic acid alkyl ester and/or a copolymerizable vinyl monomer which is copolymerizable with hydroxyl group-containing vinyl monomers.

As a copolymerizable vinyl monomer, for example, an epoxy group-containing vinyl monomer, amide group-containing vinyl monomer, cyano group-containing vinyl monomer, imide group-containing vinyl monomer, carboxyl group-containing vinyl monomer, alkoxy polyalkylene glycol group-containing vinyl monomer and other functional group-containing vinyl monomers (except for hydrocyl group-containing vinyl monomers) may be mentioned. Namely, copolymerizable vinyl monomers containing at least one kind of functional group selected from a predetermined functional groups (for example, an epoxy group, amide group, cyano group, imide group, carboxyl group and alkoxy polyalkylene glycol group, etc.) and not containing any hydroxyl group may be mentioned.

As an epoxy group-containing monomer, for example, a glycidyl (meth)acrylate and methylglycidyl (meth)acrylate, etc. may be mentioned.

As an amide group-containing vinyl monomer, for example, (meth)acrylamide, N,N-dimethyl(meth)acrylamide, N,N-diethyl(meth)acrylamide, N-isopropyl(meth)acrylamide, N-butyl(meth)acrylamide, N-methoxymethyl(meth) acrylamide, N-methylol(meth)acrylamide, N-methylolpropane(meth)acrylamide, N-vinylcarboxylic acid amide, dimethylaminopropylacrylamide, diacetoneacrylamide, N-methylolacrylamide, etc. may be mentioned. Among those, preferably N,N-dimethyl(meth)acrylamide and other N,N-dialkyl(meth)acrylamides may be mentioned and more preferably N,N-dimethylacrylamide (DMAA) may be mentioned.

As a cyano group-containing vinyl monomer, for example, acrylonitrile and methacrylonitrile, etc. may be mentioned.

As an imide group-containing vinyl monomer, for example, N-cyclohexylmaleimide, N-isopropylmaleimide, N-laurylmaleimide, N-phenylmaleimide and other maleimide-based monomers; for example, N-methylitaconimide, N-ethylitaconimide, N-butylitaconimide, N-octylitaconimide, N-2-ethylhexylitaconimide, N-cyclohexylitaconimide, N-laurylitaconimide and other itaconimide-based monomers; for example, N-(meth)acryloyloxymethylene succinimide, N-(meth)acryloyl-6-oxyhexamethylene succinimide, N-(meth)acryloyl-8-oxyoctamethylene succinimide and other succinimide-based monomers; may be mentioned.

As a carboxyl group-containing vinyl monomer, for example, (meth)acrylic acid, fumaric acid, maleic acid, itaconic acid, crotonic acid, cinnamic acid and other unsaturated carboxylic acids; for example, fumaric anhydride, maleic anhydride, itaconic anhydride and other unsaturated carboxylic anhydrides; for example, monomethyl itaconate, monobutyl itaconate, 2-acryloyloxyethyl phthalate and other unsaturated dicarboxylic acid monoesters; for example, 2-methacryloyloxyethyltrimellitic acid, 2-methacryloyloxyethylpyromellitic acid and other unsaturated tricarboxylic acid monoesters; for example, carboxyethyl acrylate, carboxypentyl acrylate and other carboxyalkyl acrylates; may be mentioned.

As alkoxypolyalkylene glycol group-containing vinyl monomer, for example, methoxypolyethylene glycol (meth) acrylate, etc. may be mentioned.

As a copolymerizable vinyl monomer, multifunctional monomers containing a plurality of functional groups which can be radically polymerizable may be furthermore mentioned.

As a multifunctional monomer, for example, ethylene glycol di(meth)acrylate, diethylene glycol di(meth)acrylate, triethylene glycol di(meth)acrylate, tetraethylene glycol di(meth)acrylate and other (mono or poly)ethylene glycol di(meth)acrylates; propylene glycol di(meth)acrylate and other (mono or poly)alkylene glycol di(meth)acrylates; and neopentyl glycol di(meth)acrylate, 1,6-hexanediol di(meth) acrylate, pentaerythritol di(meth)acrylate, trimethylolpropane tri(meth)acrylate, pentaerythritol tri(meth)acrylate, tetramethylolmethane tri(meth)acrylate, dipentaerythritol hexa(meth)acrylate and divinylbenzene, etc. may be mentioned.

As a copolymerizable vinyl monomer, in addition to the copolymerizable vinyl monomers listed above, for example, vinyl acetate, vinyl propionate and other vinyl esters; for example, ethylene, propylene, isoprene, butadiene, isobutylene and other olefin-based monomers; for example, phenyl (meth)acrylate and other aryl (meth)acrylic acid esters; for example, styrene, vinyl toluene and other aromatic vinyl; for example, methoxymethyl (meth)acrylate, ethoxyethyl (meth)acrylate and other alkoxy group-containing monomers; for example, vinyl ether and other vinyl ether-based monomers; for example, vinyl chloride and other halogen atom-containing monomers; for example, N-vinylpyrrolidone, N-(1-methylvinyl)pyrrolidone, N-vinylpyridine, N-vinylpiperidone, N-vinylpyrimidine, N-vinylpiperazine, N-vinylpyrazine, N-vinylpyrrole, N-vinylimidazole, N-vinyloxazole, N-vinylmorpholine, tetrahydrofurfuryl (meth)acrylate, (meth)acryloyl morpholine and other vinyl group-containing heterocyclic compounds; for example, (meth)acrylic acid ester-based monomers containing halogen atom, such as fluorine atom; etc. may be mentioned.

As a copolymerizable vinyl monomer, preferably functional group-containing vinyl monomers, more preferably amide group-containing vinyl monomers may be mentioned. Those copolymerizable vinyl monomers may be used alone or in combination.

When using a copolymerizable vinyl monomer, a mixing ratio thereof with respect to the total amount of a monomer composition is, for example, 10 to 50 mass % and preferably 20 to 40 mass %.

By polymerizing the monomer composition explained above, compound A can be obtained. As the polymerization method, for example, emulsion polymerization (including suspension polymerization), solution polymerization and bulk polymerization, etc. may be mentioned, and preferably emulsion polymerization and solution polymerization may be mentioned.

In emulsion polymerization, for example, along with the monomer composition explained above, a polymerization initiator, emulsifier and, when needed, a chain transfer agent, etc. are mixed in water for polymerization. More specifically, for example, a collective method (collective polymerization method), a split method (multi-step polymerization method) and other well-known emulsion polymerization method may be applied. Note that a reaction condition, etc. may be selected arbitrarily.

A polymerization initiator is not particularly limited and those normally used for emulsion polymerization may be used. For example, benzoyl peroxide, lauroyl peroxide, caproyl peroxide, t-hexyl peroxyneodecanoate, t-butyl peroxypivalate and other organic peroxides; for example, 2,2-azobis-iso-butylonitrile, 2,2-azobis-2,4-dimethylvaleronitrile, 2,2-azobis-4-methoxy-2,4-dimethylvaleronitrile, azobis-2-methylbutyronitrile (ABN-E made by Japan Hydrazine Co., Inc.) and other azo compounds; may be mentioned. Those polymerization initiators may be used alone or in combination of two or more kinds. Among those polymerization initiators, preferably azo compounds may be mentioned. A mixing ratio of the polymerization initiator may be selected arbitrarily and, for example, 0.01 to 5 parts by mass with respect to 100 parts by mass of a monomer composition.

An emulsifier is not particularly limited and well-known emulsifiers (for example, anionic emulsifier, nonionic emulsifier, etc.) normally used for emulsion polymerization may be used. A mixing ratio of an emulsifier is, for example, 0.1 to 5 parts by mass with respect to 100 parts by mass of a monomer composition.

A chain transfer agent is mixed as needed to adjust molecular weight of compound A and, for example, 1-dodecanethiol and other mercaptanes, etc. may be mentioned. Those chain transfer agents may be used alone or in combination, and the mixing ratio is, for example, 0.1 to 1 part by mass with respect to 100 parts by mass of a monomer composition.

Compound A obtained by emulsion polymerization is prepared as emulsion (water dispersion type), that is, as aqueous dispersion of compound A. A solid concentration (non-volatile content) of compound A in aqueous dispersion is, for example, 5 to 50 mass %.

In solution polymerization, along with the monomer composition explained above, a polymerization initiator and, when needed, a chain transfer agent, etc. explained above are mixed in an organic solvent and polymerization is performed.

An organic solvent would be any as long as the monomer composition explained above can be dissolved therein and, for example, acetone, methyl ethyl ketone, methyl isobutyl ketone and other ketone-based organic solvents; methyl acetate, ethyl acetate, butyl acetate and other ester-based organic solvents; dimethylformamide, dimethyl sulfoxide, N-methyl-2-pyrrolidone and other polar solvents; methyl alcohol, ethyl alcohol, isopropyl alcohol and other alcohol-based organic solvents; toluene, xylene, "Solvesso 100" (made by ExxonMobil Chemical Company) and other aromatic hydrocarbon-based solvents; n-hexane, cyclohexane, methylcyclohexane, "LAWS" (made by Shell Chemicals) "Mineral Spirit EC" (made by Shell Chemicals) and other aliphatic/alicyclic hydrocarbon-based organic solvents; methyl cellosolve, ethyl cellosolve, butyl cellosolve and other cellosolve-based organic solvents; tetrahydrofuran, dioxane and other ether-based organic solvents; n-butyl carbitol, iso-amyl carbitol and other carbitol-based organic solvents; etc. may be mentioned. Those organic solvents may be used alone or in combination of two or more kinds. Note that a mixing ratio of the organic solvent may be set arbitrarily in accordance with the purpose and use.

In solution polymerization, the monomer composition explained above is polymerized in an organic solvent in the presence of a polymerization initiator, for example, at 30 to 150° C. for 3 to 12 hours.

Compound A obtained by solution polymerization is prepared as an organic solvent solution (solution type), that is, an organic solvent solution of compound A. a solid content concentration of compound A in the organic solvent solution is, for example, 5 to 50 mass % and preferably 10 to 40 mass %.

A weight average molecular weight (Mw) of compound A is, for example, 5000 to 150000 and preferably 10000 to 120000. Also, a number average molecular weight (Mn) of the obtained compound A is, for example, 1000 to 50000 and preferably 5000 to 50000.

Note that the Mw and Mn values can be calculated from a chromatogram (chart) obtained by measuring a molecular weight distribution of compound A with a gel permeation chromatograph (GPC) equipped with a differential refractive index detector (RID) by using standard polystyrene as an analytical curve (it will be the same below).

A glass transition temperature (Tg) obtained from the Fox equation of compound A is, for example, 23° C. or higher, preferably 30° C. or higher, more preferably 45° C. or higher but normally not higher than 120° C. When the glass transition temperature of compound A is the same or higher than the lower limit explained above, excellent sliding properties can be ensured on a coating surface obtained by using a coating material.

When preparing compound A as a solution, viscosity (25° C.) thereof is, for example, 2 to 200 mPa·a and preferably 5 to 150 mPa·s. Note that viscosity can be measured by using a cone-plate viscometer based on (JIS K 5600-2-3:1999, "Testing Methods for Paints—Part 2: Characteristics and Stability of Paints—Section 3: Viscosity (Cone-Plate Viscometer Methods)") (It will be the same below).

A hydroxyl number (based on JIS K 1557-1:2007 (ISO 14900:2001) 4.2 Method B in "Plastics—Polyols for Use in the Production of Polyurethane—Part 1: Determination of Hydroxyl Number") of compound A is, for example, 5 to 70 mgKOH/g, preferably 10 to 50 mgKOH/g and more preferably 10 to 45 mgKOH/g. When a hydroxyl number in compound A is in the ranges above, excellent hardness can be ensured and sliding properties can be improved on a coating surface obtained by using a coating material.

As compound B (diisocyanate), for example, aromatic diisocyanate (for example, tolylene diisocyanate(2,4- or 2,6-tolylene diisocyanate or a mixture thereof), phenylene diisocyanate(m-, p-phenylene diisocyanate or a mixture thereof), 1,5-naphthalene diisocyanate, diphenylmethane diisocyanate(4,4'-, 2,4'- or 2,2'-diphenylmethane diisocyanate or a mixture thereof), 4,4'-toluidine diisocyanate, etc.); aromatic aliphatic diisocyanate (for example, xylylene diisocyanate(1,3- or 1,4-xylylene diisocyanate or a mixture thereof), tetramethylxylylene diisocyanate(1,3- or 1,4-tetramethylxylylene diisocyanate or a mixture thereof), etc.), aliphatic diisocyanate (for example, 1,3-trimethylene diisocyanate, 1,4-tetramethylene diisocyanate, 1,5-pentamethylene diisocyanate, 1,6-hexamethylene diisocyanate, etc.); alicyclic diisocyanate (for example, cyclohexane diisocyanate, 3-isocyanatomethyl-3,5,5-trimethylcyclohexyl isocyanate (isophorone diisocyanate), methylenebis(cyclohexyl isocyanate), norbornane diisocyanate, bis(isocyanatemethyl)cyclohexane, etc.); may be mentioned. Those compound B may be used alone or in combination or two or more kinds.

As compound B, preferably aliphatic diisocyanate and alicyclic diisocyanate may be mentioned in terms of light resistance and yellowing resistance, etc.

Compound C (polyether polyol) may be obtained by using, for example, low molecular weight polyol (for example, ethyl glycol, propylene glycol, glycerin, etc.) or aromatic/aliphatic polyamine (for example, ethylenediamine and tolylenediamine, etc.) as an initiator to bring an addition reaction of alkylene oxide, such as ethylene oxide and/or propylene oxide. For example, polyethylene polyol, polypropylene polyol, polyethylene polypropylene polyol (random or block copolymer), etc. may be mentioned. Also, as polyether polyol, polytetramethylene ether glycol, etc. obtained by ring opening polymerization of tetrahydrofuran may be mentioned, as well.

Those compound C may be used alone or in combination of two or more kinds.

A hydroxyl number (based on Method B in JIS K 1557-1 (2007)) of compound C is, for example, 3 to 60 mgKOH/g and preferably 5 to 300 mgKOH/g.

An average functional group number of compound C is, for example, 1 to 8 and preferably 2 to 6. Note that an average functional group number of compound C can be obtained from a kind and mixing ratio of an initiator.

Mn in compound C is, for example, 300 to 30000 and preferably 700 to 20000. Note that Mn in compound C can be also obtained from the hydroxyl number and average functional group number explained above.

In compound D (a photopolymerizable compound having both a hydroxyl group and a photopolymerizable group), a photopolymerizable group is a photopolymerizable functional group and specifically, for example, (meth)acryloyl group, alkenyl group, cinnamoyl group, cinnamylidene acetyl group, benzalacetophenone group, styrylpyridine group, α-phenylmaleimide group, phenylazide group, sulfonylazide group, carbonylazide group, diazo group, o-quinone diazide group, furylacryloyl group, coumarin group, pyrone group, anthracene group, benzophenone group, stilbene group, dithiocarbamate group, xanthate group, 1,2,3-thiadiazole group, cyclopropene group and azadioxabicyclo group, etc. may be mentioned. As a photopolymerizable group, preferably (meth)acryloyl group may be mentioned.

In compound D, numbers of hydroxyl group and photopolymerizable group are not particularly limited and may be one (singular) or more (plural). When compound D has a plurality of photopolymerizable groups, respective photopolymerizable groups may be identical or different from one another.

As compound D, for example, photopolymerizable compounds having one hydroxyl group and one photopolymerizable group in one molecular, such as the hydroxyl group-containing vinyl monomers mentioned above; photopolymerizable compounds having one hydroxyl group and two or more photopolymerizable group in one molecular, such as pentaerythritol tri(meth)acrylate and dipentaerythritol penta(meth)acrylate; photopolymerizable compounds having two or more hydroxyl groups and two or more photopolymerizable groups in one molecular, such as pentaerythritol di(meth)acrylate, dipentaerythritol tri(meth)acrylate and dipentaerythritol tetra(meth)acrylate; and photopolymerizable compounds having two hydroxyl groups and one photopolymerizable group in one molecular, such as 2,2-dihydroxyethyl acrylate, may be mentioned. Those compounds D may be used alone or in combination of two or more kinds.

Also, compound D1 (a photopolymerizable compound not having a hydroxyl group but having a photopolymerizable group) may be used together with compound D as needed.

As compound D1, for example, ethylene glycol di(meth)acrylate, propylene glycol di(meth)acrylate, neopentyl glycol di(meth)acrylate and other alkylene glycol di(meth)acrylate;

for example, diethylene glycol di(meth)acrylate, tetraethylene glycol di(meth)acrylate, dipropylene glycol di(meth)acrylate, tripropylene glycol di(meth)acrylate and other polyalkylene glycol di(meth)acrylate;

for example, 1,4-butanediol di(meth)acrylate, 1,6-hexanediol di(meth)acrylate, 1,9-nonanediol di(meth)acrylate, dicyclopentadiene di(meth)acrylate, neopentyl glycol adipate di(meth)acrylate, hydroxypivalic acid neopentyl glycol di(meth)acrylate, tricyclodecane dimethanol di(meth)acrylate, dicyclopentenyl di(meth)acrylate;

for example, bisphenol AEO-added diacrylate, caprolactone-modified dicyclopentenyl di(meth)acrylate, ethyleneoxide-modified phosphate di(meth)acrylate, arylated cyclohexyl di(meth)acrylate, isocyanurate di(meth)acrylate or modified alkyleneoxides of those, divinylbenzene, butanediol-1,4-divinylether, cyclohexanedimethanol divinyl ether, diethylene glycol divinyl ether, dipropylene glycol divinyl ether, hexanediol divinyl ether, triethylene glycol divinyl ether, phenyl glycidyl ether acrylate hexamethylene diisocyanate urethane prepolymer (AH-600 made by KYOEISHA CHEMICAL Co., LTD), phenyl glycidyl ether acrylate toluene diisocyanate urethane prepolymer (AT-600 made by KYOEISHA CHEMICAL Co., LTD), and other photopolymerizable multifunctional compounds having two photopolymerizable groups in one molecular;

for example, trimethylolpropane tri(meth)acrylate, tris (acryloxyethyl)isocyanurate, or modified alkyleneoxide of those, tri(meth)acrylate of modified isocyanuric acid alkyleneoxide, and other photopolymerizable multifunctional compounds having three photopolymerizable groups in one molecular;

for example, ditrimethylolpropane tetra(meth)acrylate, pentaerythritol tetra(meth)acrylate or modified alkyleneoxide of those, and other photopolymerizable multifunctional compounds having four photopolymerizable groups in one molecular;

for example, dipentaerythritol hexa(meth)acrylate, pentaerythritol triacrylate hexamethylenediisocyanate urethane prepolymer (UA-306H made by KYOEISHA CHEMICAL Co., LTD), caprolactone-modified dipentaerythritol hexa(meth)acrylate or modified alkyleneoxide of those, and other photopolymerizable multifunctional compounds having 6 photopolymerizable groups in one molecular; etc. may be mentioned. Those compounds D1 may be used alone or in combination of two or more kinds.

Note that when using both compound D and compound D1, their mixing ratios are, for example, 10 to 90 parts by mass and preferably 50 to 70 parts by mass for compound D and, for example, 10 to 90 parts by mass and preferably 30 to 50 parts by mass for compound D1 with respect to the total amount 100 parts by mass of compound D and compound D1.

In manufacturing a coating material, a mixing ratios of the respective material components explained above (namely, compounds A, B, C and D) are as below with respect to their total amount 100 parts by mass.

Compound A: for example, 5 to 90 parts by mass, preferably 10 to 80 parts by mass, Compound B: for example, 1 to 40 parts by mass, preferably 5 to 30 parts by mass, Compound C: for example, 1 to 60 parts by mass, preferably 5 to 40 parts by mass, Compound D: for example, 5 to 70 parts by mass, preferably 10 to 50 parts by mass.

When the mixing ratios of the respective material components are in the above ranges, it is possible to improve antifouling properties on a coating surface obtained by using the coating material and to ensure excellent easiness in wiping off dirt.

On the other hand, when the mixing ratio of compound A is less than the lower limit above, sliding properties on a coating surface obtained by using the coating material becomes poor and easiness in wiping off dirt cannot be ensured in some cases. Also, when the mixing ratio of compound A exceeds the upper limit above, antifouling properties on a coating surface obtained by using the coating material cannot be obtained sufficiently and, for example, fingerprints, etc. may be attached easily in some cases.

When the mixing ratio of compound B is less than the lower limit above, antifouling properties on a coating surface obtained by using the coating material cannot be ensured sufficiently and, for example, fingerprints, etc. may be attached easily in some cases. Also when the mixing ratio of compound B exceeds the upper limit explained above, antifouling properties on a coating surface obtained by using the coating material cannot be ensured sufficiently and, for example, fingerprints, etc. may be attached easily in some cases.

When the mixing ratio of compound C is less than the lower limit above, antifouling properties on a coating surface obtained by using the coating material cannot be ensured sufficiently and, for example, fingerprints, etc. may be attached easily in some cases. Also, when the mixing ratio of compound C exceeds the upper limit above, sliding properties on a coating surface obtained by using the coating material becomes poor and easiness in wiping off dirt cannot be ensured sufficiently in some cases.

When the mixing ratio of compound D is less than the lower limit above, sliding properties on a coating surface obtained by using the coating material become poor and easiness in wiping off dirt cannot be ensured sufficiently in some cases. Also, when the mixing ratio of compound D exceeds the upper limit above, sliding properties on a coating surface obtained by using the coating material become poor and easiness in wiping off dirt cannot be ensured sufficiently in some cases.

For reactions of the respective components explained above, for example, a well-known method, such as a one-shot method and prepolymer method, may be applied and a prepolymer method is preferably applied.

In the prepolymer method, compounds B, C and D are brought to react to synthesize a prepolymer having both an isocyanate group and photopolymerizable group in molecular ends first, then, the isocyanate group of obtained prepolymer is brought to react with a hydroxyl group in a side chain of compound A. Specifically, compound B and compounds C and D are prescribed (mixed) so that an equivalent ratio of isocyanate group in compound B to a hydroxyl group in compounds c and D (NCO/hydroxyl group) exceeds 1, for example, 1.1 to 10 and preferably 1.5 to 4.5, and an urethanization reaction is brought in a reaction container, for example, at room temperature to 150° C., for example, for 0.5 to 24 hours.

In the urethanization reaction, an organic solvent may be mixed as needed. As an organic solvent, for example, the organic solvents listed above may be mentioned. Those organic solvents may be used alone or in combination of two or more kinds. Note that a mixing ratio of the organic solvent may be set arbitrarily in accordance with the purpose and use.

In the urethanization reaction above, an urethanization catalyst may be added as needed. As an urethanization catalyst, for example, dimethyl tin dilaurate, dibutyl tin dilaurate, dioctyl tin laurate, dioctyl tin dilaurate, bismuth-based catalyst, etc. may be mentioned. Those urethanization catalysts may be used alone or in combination of two or more kinds.

In the urethanization reaction above, a polymerization inhibitor may be furthermore mixed as needed. As a polymerization inhibitor, for example, p-benzoquinone, p-methoquinone, naphthoquinone, phenanthraquinone, toluquinone, 2,5-diphenyl-p-benzoquinone and other quinones, for example, hydroquinone, p-t-butylcatechol, 2,5-di-t-butylhydroquinone, mono-t-butylhydroquinone, 2,5-di-t-amylhydroquinone and other hydroquinones, for example, p-methoxyphenol, di-t-butyl paracresol hydroquinone monomethylether and other phenols, etc. may be mentioned. Those polymerization inhibitors may be used alone or in combination of two or more kinds. Also, among those, preferably phenols and more preferably p-methoxyphenol may be mentioned.

Furthermore, when needed, unreacted compound B may be removed from an obtained prepolymer, for example, by a well-known removal means, such as distillation and extraction. In the prepolymer, an average functional group number in an isocyanate group is, for example, 1 to 3.0 and preferably 1 to 2.5.

In a prepolymer to be obtained, Mw is, for example, 4000 to 40000 and preferably 8000 to 25000. Mn in a prepolymer to be obtained is, for example, 1000 to 15000 and preferably 2000 to 10000.

Also, a prepolymer may be prepared as a solution of the organic solvents explained above and, in that case, a solid content concentration thereof is, for example, 10 to 90 mass % and preferably 20 to 80 mass %.

When preparing a prepolymer as a solution, viscosity thereof (25° C.) is, for example, 2 to 20 mPa·s and preferably 5 to 10 mPa·s.

Next, in this method, an obtained prepolymer and compound A are prescribed (mixed), for example, in the organic solvent explained above, so that an equivalent ratio of an isocyanate group in the prepolymer to a hydroxyl group in compound A (NCO/hydroxyl group) becomes, for example, 0.7 to 1.3 and preferably 0.9 to 1.1, and an urethanization reaction is brought in a reaction container, for example, at room temperature to 150° C., for example, for 0.5 to 24 hours. In the urethanization reaction, in the same way as above, an urethanization catalyst as explained above and polymerization inhibitor may be furthermore added as needed.

According to the coating material obtained by such a prepolymer method, it is possible to improve antifouling properties on a coating surface and to ensure excellent easiness in wiping off dirt.

The coating material in the present example may be added with well-known additives as needed, such as an ultraviolet absorbent, antioxidant, light stabilizer, heat-resistant stabilizer, antistatic agent and defoaming agent.

Those additives may be added in advance to at least any one of the respective material components explained above (that is, compounds A, B, C and D) and/or the prepolymer explained above, separately added during the reaction of the prepolymer with compound A or directly added to the coating material obtained by the reaction of the prepolymer and compound A. Note that a mixing ratio of the additives may be set arbitrarily in accordance with the purpose and use.

Mw in the coating material in the present example is, for example, 5000 to 100000 and preferably 10000 to 80000. Mn in the coating material is, for example, 1000 to 50000 and preferably 4000 to 40000.

The coating material in the present example may be prepared as a solution of the organic solvents explained above and, in that case, a solid content concentration thereof is, for example, 10 to 90 mass % and preferably 20 to 80 mass %. When preparing the coating material as a solution, viscosity thereof (25° C.) is, for example, 1 to 100 mPa·s and preferably 5 to 80 mPa·s.

According to this coating material, it is possible to improve antifouling properties on a coating surface and to ensure excellent wiping properties and sliding properties.

As a curable resin, for example, thermosetting resin and ionizing radiation curable resin, etc. may be mentioned.

As a thermosetting resin, for example, melamine-based resins, phenol-based resins and urethane-based resins, etc. may be mentioned. Those thermosetting resins may be used alone or in combination of two or more kinds. As an ionizing radiation curable resin, photopolymerizable prepolymers, which crosslink and cure due to an irradiation of an ionizing radiation (ultraviolet or electronic ray), may be used. As a photopolymerizable prepolymer, preferably acryl-based prepolymers having two or more acryloyl groups in one molecular, wherein a three-dimensional mesh structure is formed by crosslinking and curing, may be mentioned.

As an acrylic prepolymer, specifically, for example, urethane acrylate, polyester acrylate, epoxy acrylate, melamine acrylate, polyfluoro alkyl acrylate and silicon acrylate, etc. may be mentioned. Those acrylic prepolymers may be used alone or in combination of two or more kinds. As an acrylic prepolymer, preferably urethane acrylate may be mentioned.

A photopolymerizable prepolymer may be used alone as an ionizing radiation curable resin. However, in terms of improving a crosslinking curing property and hardness, a photopolymerizable monomer may be used along with a photopolymerizable prepolymer (acrylic prepolymer).

As a photopolymerizable monomer, for example, 2-ethylhexyl acrylate, 2-hydroxyethyl acrylate, 2-hydroxypropyl acrylate, buthoxyethyl acrylate and other monofunctional acrylic monomers; for example, 1,6-hexanediol diacrylate, neopentyl glycol diacrylate, diethylene glycol diacrylate, polyethylene glycol diacrylate, hydroxypivalic acid ester neopentyl glycol diacrylate and other bifunctional acrylic monomers; for example, dipentaerythritol hexaacrylate, trimethylpropane triacrylate, pentaerythritol triacrylate and other multifunctional (tri functional or more) acrylic monomers; etc. may be mentioned. Those photopolymerizable monomers may be used alone or in combination of two or more kinds. A mixing ratio of a photopolymerizable monomer is not particularly limited and may be set arbitrarily in accordance with the purpose and use.

In the present example, as an ionizing radiation curable resin, for example, an ionizing radiation curable organic-inorganic hybrid resin may be used, as well. An ionizing radiation curable organic-inorganic hybrid resin is different from a conventional complex typified by glass fiber reinforced plastic (FRP) and, wherein organic matter and inorganic matter are closely mixed, the dispersion state is at a molecular level or close to that, and inorganic component reacts with organic component due to irradiation of ionizing radiation so as to be able to form a coating.

As an inorganic component in the hybrid resin, for example, silica, titania and other metal oxides may be mentioned, and silica is preferably mentioned. As silica, reactive silica, wherein a photosensitive group having photopolymerization reactiveness on its surface is introduced, may be mentioned. Those having an average particle diameter of preferably 1 nm or more but preferably 100 nm or less and more preferably 10 nm or less are used as the reactive silica. By using reactive silica having an average particle diameter in a predetermined range, transparency can be maintained easily when formed into a coating film. A content of an inorganic component in the hybrid resin is preferably 65 wt % or less and more preferably 40 wt % or less. By setting the content of inorganic component to be 65 wt % or less, transparency can be maintained easily when formed into a coating film.

As an organic component in a hybrid resin, compounds having a polymerizable unsaturated group (for example, polyvalent unsaturated organic compounds having two or more polymerizable unsaturated groups in a molecular or monovalent unsaturated compounds having one polymerizable unsaturated group in a molecular, etc.) capable of polymerizable with the above-explained inorganic components (preferably reactive silica), may be mentioned.

Those curable resins may be used alone or in combination of two or more kinds.

As a curable resin, preferably, an ionizing radiation curable resin may be mentioned. When an ionizing radiation curable resin is used as a curable resin, it is possible to give excellent scratch resistance to a cured product to be obtained (protective film 3).

An ionizing radiation curable resin is available as a marketed product and specifically, for example, UNIDIC 17-813 (urethane acrylate, solid content concentration 80 mass %, made by DIC Corporation) and UV 7600BA (urethane acrylate, solid content concentration 80 mass %, made by The Nippon Synthetic Chemical Industry Co., Ltd.), etc. may be mentioned.

A curable resin may be prepared as a solution of the above-explained organic solvents and, in that case, a solid content concentration thereof is, for example, 10 to 90 mass % and preferably 20 to 80 mass %.

A curable composition of the present example can be obtained by mixing and agitating the above-explained coating material and curable resin.

As to mixing ratios of the coating material and curable resin in a curable composition, with respect to their total amount of 100 parts by mass, a mixing ratio of the coating material (solid content) is preferably 2 parts by mass or more, more preferably 5 parts by mass or more, furthermore preferably 10 parts by mass or more but preferably 40 parts by mass or less and more preferably 30 parts by mass or less.

Also, a mixing ratio of the curable resin (solid content) is preferably 60 parts by mass or more, more preferably 70 parts by mass or more and preferably 98 parts by mass or less, more preferably 95 parts by mass or less and furthermore preferably 90 parts by mass or less.

In the present example, if a coating material is contained even a little in the curable composition, fingerprint resistance and sliding properties are expected to be improved. Therefore, a mixing ratio of the coating material is not particularly limited in the present invention. However, as a preferable mode, when a mixing ratio of the coating material is not less than the lower limit (2 parts by mass) explained above, fingerprint resistance and sliding properties can be preferable. Also, when the mixing ratio of the coating material does not exceed the upper limit (40 parts by mass) explained above, a decline of humidity resistance and scratch resistance can be prevented.

In the present example, even when a large amount of curable resin is included in the curable composition, fingerprint resistance and sliding properties can be both obtained. Therefore, a mixing ratio of a curable resin is not particularly limited in the present invention. However, as a preferable mode, when the mixing ratio of a curable resin does not exceed the upper limit (98 parts by mass) explained above, a decline of fingerprint resistance and sliding properties can be prevented easily. Also, when the mixing ratio of the curable resin is not less than the lower limit (60 parts by mass) explained above, humidity resistance and scratch resistance can be favorable.

Note that when using an ionizing radiation curable resin as a curable resin and curing the ionizing radiation curable resin with ultraviolet irradiation, in addition to the above-explained photopolymerizable prepolymer and photopolymerizable monomer, additives, such as a photopolymerization initiator and photopolymerization accelerator, may be furthermore mixed in the curable composition as needed.

As a photopolymerization initiator, 2,2-dimethoxy-1,2-diphenylethane-1-one, 1-hydroxy-cyclohexyl-phenyl-ketone, acetophenone, benzophenone, Michler's ketone, benzoin, benzylmethyl ketal, benzoil benzoate, α-acyloxime ester, thioxanthone, etc. may be mentioned. Those photopolymerization initiators may be used alone or in combination of two or more kinds. When mixing a photopolymerization initiator, a mixing ratio thereof is, for example, 3 to 7 parts by mass with respect to the total amount (solid content) of 100 parts by mass of a coating material and curable resin.

A photopolymerization accelerator is capable of accelerating curing speed by reducing a polymerization obstacle caused by an air when curing and, for example, p-dimethylaminobenzoic acid isoamyl ester, p-dimethylaminobenzoic acid ethyl ester, etc. may be mentioned. Those photopolymerization accelerators may be used alone or in combination of two or more kinds. When mixing a photopolymerization accelerator, a mixing ratio thereof is not particularly limited and may be set arbitrarily in accordance with the purpose and use.

Note that, in the curable composition, in a range of not hindering the performances explained above, for example, a leveling agent, defoaming agent and other surfactants, for example, an antioxidant, ultraviolet ray absorbent and other additives, furthermore, a pigment, etc. for providing anti-glare and blocking prevention properties, and other well-known additives may be mixed. Note that a mixing ratio of additives is not particularly limited and may be set arbitrarily in accordance with the purpose and use.

Also, a curable composition may be prepared as a solution of the organic solvents explained above and, in that case, a solid content concentration thereof is, for example, 10 to 90 mass % and preferably 20 to 80 mass %.

An example of a method of forming a protective film 3 configured from a curable product of the curable composition explained above (that is, a method of manufacturing a surface protective sheet 1 of the present example) is as below.

A curable composition explained above is applied on a surface of a substrate 2, dried as needed and then cured, for example, by irradiation of an ionizing radiation or heating. Thereby, a protective film 3 is formed on the surface of the substrate 2 and a surface protective sheet 1 can be obtained.

As an application method, for example, applying by using a dip coating method, spray coating method, roll coating method, doctor blade coating method and screen printing method, etc. and casting by using a bar coater and applicator, etc. may be mentioned.

In the present example, it is possible to obtain a surface protective sheet 1 by other method than those explained above, such as a transfer method. In a transfer method, while it is not illustrated, for example, the curable composition explained above is applied on a surface of a well-known release paper first, dried as needed, then cured, for example, by irradiating an ionizing radiation or heating so as to form a protective film 3. After that, the obtained protective film 3 is attached with pressure to the substrate 2, then, the release paper is removed (transferred) so as to obtain a surface protective sheet 1.

A contact angle with water on the surface of the protective film 3 is preferably 40 to 100 degrees. When controlled to 40 degrees or more, a contact area with water is reduced. Consequently, water component of fingerprints can be easily removed and wiping properties of fingerprints improve. Also, when controlled to 100 degrees or less, the contact area with water does not become too small and attached fingerprints can be less noticeable. Particularly, it is more preferable to control to 40 to 80 degrees. By controlling a contact angle with water on the protective film 3 to be within a predetermined range, wiping properties of fingerprints can be also enhanced in addition to improving low visibility of fingerprints.

A contact angle with hexadecane of the surface of the protective film 3 is preferably 50 degrees or less. By controlling the contact angle with hexadecane to 50 degrees or less, oil components of fingerprints become wet and spread. Thus, attached fingerprints becomes less noticeable (improving low visibility of fingerprints) and, furthermore, fingerprints after wiping can be less noticeable. Particularly, it is preferable to control it to be 30 degrees or less.

Note that values of a contact angle with water and that with hexadecane are both measured by a method based on JIS-R3257 (1999).

Wet tension of the protective film 3 based on JIS-K6768 is preferably 27 to 45 mN/m and more preferably 31 to 37 mN/m.

A thickness of the protective film 3 is, for example, 1 μm or more in terms of scratch resistance and, for example, 10 μm or less in terms of preventing cracks.

The protective film 3 preferably has pencil hardness based on JIS-K5400: 1990 of, for example, H or more, preferably 2H or more and further preferably 3H or more in terms of preventing scars.

The protective film 3 may be formed on both sides of the substrate 2. Alternatively, one surface of the substrate 2 may be provided with the protective film 3 and the other surface may be provided with a general protective film (hard coat film).

The surface protective sheet 1 according to the present example is capable of improving antifouling properties on its surface as well as ensuring excellent wiping properties and sliding properties.

The surface protective sheet 1 of the present example is placed on a surface of, for example, an electronic device body 4, cover glass of clocks and instruments, window glass and a display device, etc. of showcases, etc. and is suitably used for protecting the surfaces. Preferably, it is used for the purpose of surface protection of electronic device bodies 4.

Namely, an electronic device 4a in the present example is, as shown in FIG. 1, configured by arranging the surface protective sheet 1 of the present example in a way that the substrate 2 side faces the electronic device body 4.

As the electronic device body 4, for example, a liquid crystal display device, CRT display device, plasma display device, EL display device and other display devices, and mobile information terminal, personal computer and touch panel, etc. provided with those display devices may be mentioned.

As an electronic device body 4, preferably, a touch panel (resistance film type touch panel and electrostatic capacitance type touch panel, etc.), which is strongly required to have both fingerprint preventing properties and sliding properties, may be mentioned and particularly preferably an electrostatic capacitance type touch panel may be mentioned.

A resistance film type touch panel is formed by a basic configuration, wherein an upper electrode having a transparent conductive layer on one surface of a transparent substrate and a lower electrode having a transparent conductive layer on the other surface of the transparent substrate are arranged in a way that the transparent conductive layers of the upper electrode and lower electrode face to each other via a spacer.

In such a resistance film type touch panel, the surface protective sheet 1 explained above may be used as a transparent substrate of the upper electrode, or the surface protective sheet 1 explained above may be placed on a transparent substrate of the upper electrode.

Electrostatic capacitance type touch panels can be divided to a surface capacitive type and projected capacitive type.

The surface capacitive type is formed by the basic configuration, wherein one surface of a substrate is provided with a transparent conductive film and a protective film and electrodes are furthermore arranged at four corners. As a substrate and transparent conductive film composing such a surface capacitive type touch panel, well-known transparent conductive film substrates may be used. In an electrostatic capacitance type touch panel of surface capacitive type as such, the surface protective sheet 1 explained above is used as the protective layer or the surface protective sheet 1 may be arranged on the protective layer.

The projected capacitance type is formed by the basic configuration, wherein an X-axis trace as a conductive element group formed along a predetermined first direction, a Y-axis trace as a conductive element group formed along a second direction crossing with the X-axis trace, an insulating layer arranged at least at a crossing portion of the X-axis trace and the Y-axis trace, and a connecting wiring to an external line for taking out are provided on a transparent substrate. In such a projected capacitive type electrostatic capacitance type touch panel, the surface protective sheet 1 explained above is used as the transparent substrate, alternatively, the surface protective sheet 1 is arranged on the transparent substrate.

According to an electronic device 4a comprising an electronic device body 4 and a surface protective sheet 1 arranged on a surface of the body 4, antifouling properties on the surface protective sheet 1 surface can be improved and excellent wiping properties and sliding properties can be ensured.

The surface protective sheet 1 explained above may be used for manufacturing, for example, a component 6 (for example, a chassis of a touch panel, etc.) composing an electronic device.

Figure 2A:
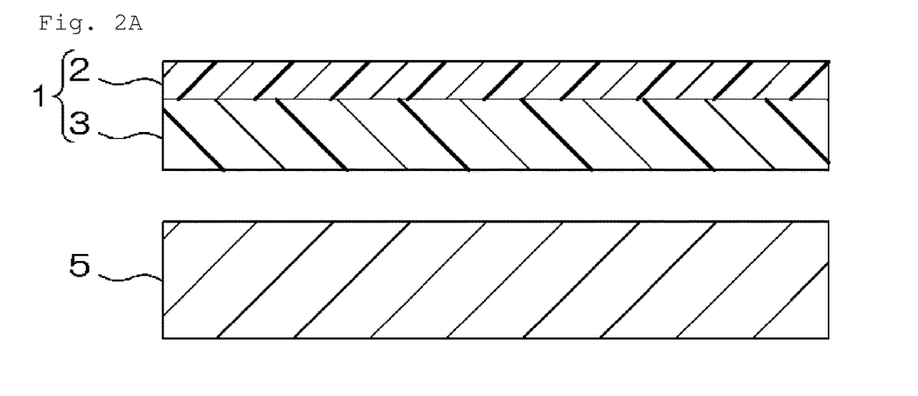
FIG. 2A is an illustration of a first step showing an example of a method of manufacturing a component of the present invention.
Figure 2B:
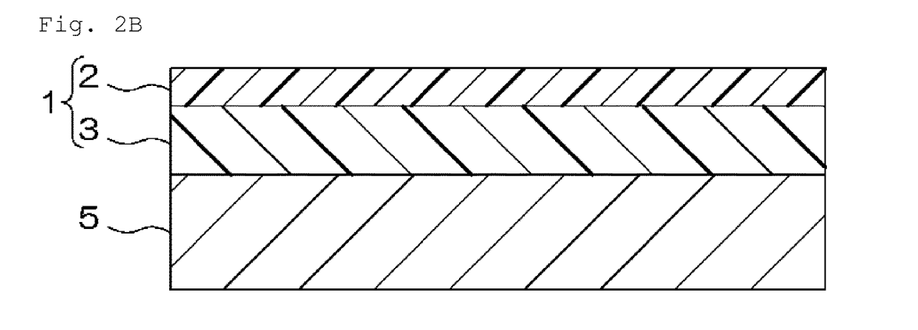
FIG. 2B is an illustration of a second step continued from FIG. 2A.
Figure 2C:
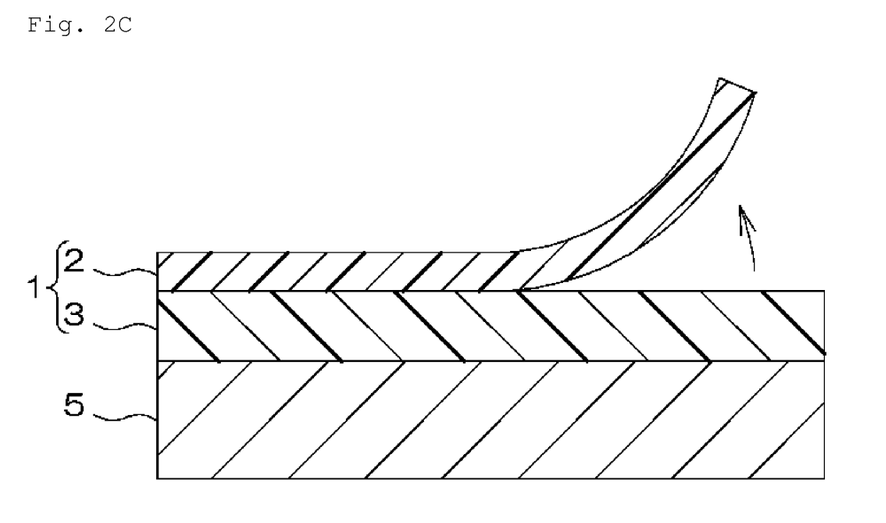
FIG. 2C is an illustration of a third step continued from FIG. 2B.
Figure 2D:
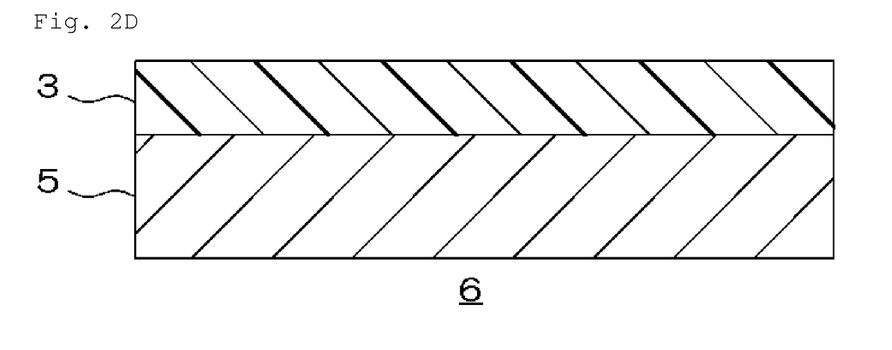
FIG. 2D is an illustration of a fourth step continued from FIG. 2C.

An example of a method of manufacturing a component 6 of the present invention will be explained. First, as shown in FIG. 2A, a component body 5, which is a body of the component 6 composing an electronic device, and the surface protective sheet 1 explained above are prepared. As the component body 5, for example, a chassis of a touch panel, etc. may be mentioned. Next, as shown in FIG. 2B, a protective film 3 of the surface protective sheet 1 is attached on a surface of the component body 5, then, heated and pressurized as needed. In this case, it is preferable that a not-illustrated adhesive layer is provided on the protective film 3. Next, as shown in FIG. 2C, a substrate 2 of the surface protective sheet 1 is removed from the protective film 3. As a result, as shown in FIG. 2D, the protective film 3 can be transferred to the surface of the component body 5, and the component 6 comprising the component body 5 and the protective e film 3 can be obtained.

A manufacturing method of a component 6 is not limited to the above explanation and, for example, the component body 5 and the surface protective sheet 1 may be obtained integrally. An example thereof will be explained.

Figure 3A:
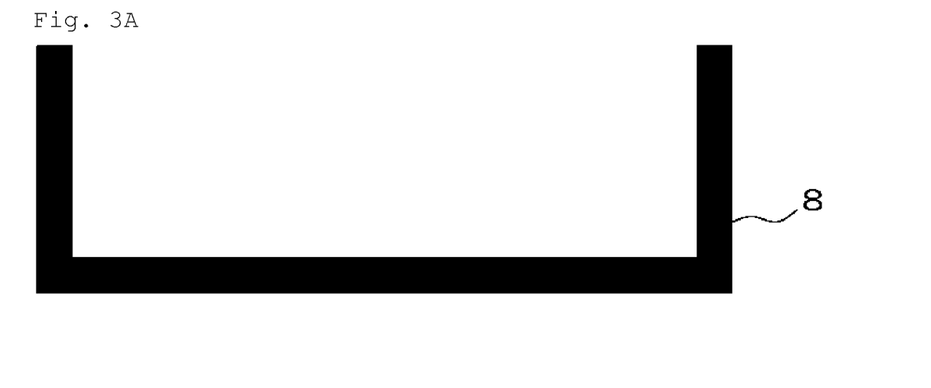
FIG. 3A is an illustration of a first step showing an example of a method of manufacturing a component of the present invention.
Figure 3B:
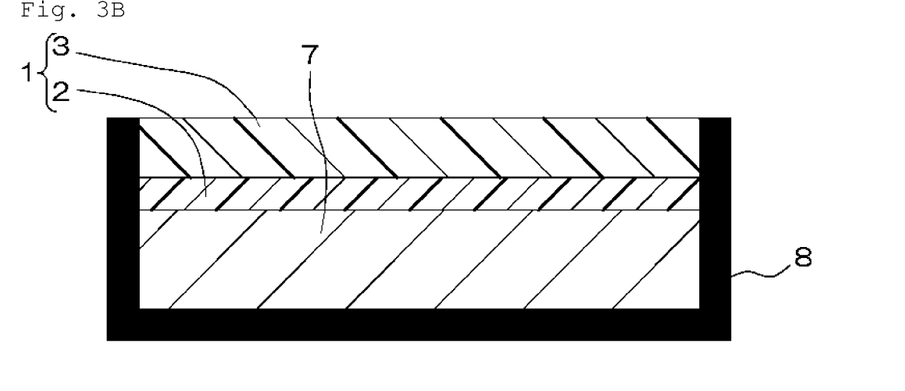
FIG. 3B is an illustration of a second step continued from FIG. 3A.
Figure 3C:
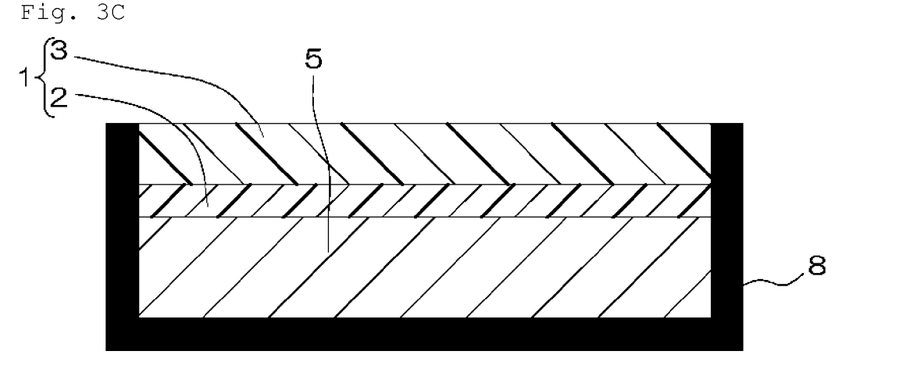
FIG. 3C is an illustration of a third step continued from FIG. 3B.
Figure 3D:
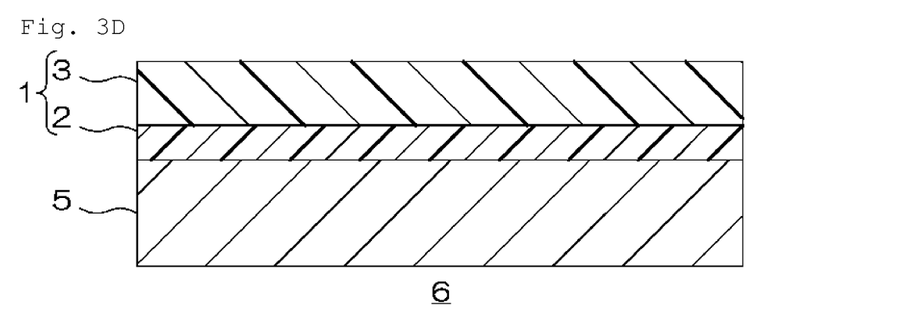
FIG. 3D is an illustration of a fourth step continued from FIG. 3C.

First, as shown in FIG. 3A, a mold 8 for molding a component body 5 is prepared. Next, as shown in FIG. 3B, a surface protective sheet 1 is arranged inside the mold 8 and a material (for example, resin pellets, etc.) 7 of the component body 5 is filled in the mold 8. Subsequently, as shown in FIG. 3C, by using a well-known method of, for example, heating and melting the material 7 in the mold 8 and cooling after that, the material of the component body 5 is molded integrally with the surface protective sheet 1. A component 6 is obtained thereby. After that, as shown in FIG. 3D, the component 6 is released from the mold 8. Consequently, the component 6, wherein the surface protective sheet 1 is integrated on the surface of the component body 5, can be manufactured.

By using the component 6 manufactured by the method above, it is possible to obtain an electronic device provided with an improved antifouling properties and excellent wiping properties and sliding properties.

Note that, in the above explanation, the protective film 3 was formed only on one surface of the substrate 2, however, it is not limited to that and the protective film 3 can be formed on both front and back surfaces of the substrate 2, as well.

EXAMPLES

Next, the present invention will be explained based on synthesis examples, preparation examples, examples and comparative examples, however, the present invention is not limited to the examples below. In the examples, "part" and "%" are based on mass unless otherwise mentioned.

Note that measurement methods of physical properties used in synthesis examples, etc. will be explained below.
<Measurements of Mw and Mn by Using Gel Permeation Chromatography>

A molecular weight distribution was obtained by taking approximately 0.2 mg as a sample, dissolving the same in 10 mL of tetrahydrofuran and measuring by using a GPC provided with a RID. After that, from the obtained chromatogram (chart), Mw of the sample was calculated by using a standard polystyrene as an analytical curve. The measurement apparatus and measurement condition are as below.

Data Processing Apparatus: Product Number HLC-8220 GPC (made by TOSOH CORPORATION)
RID: RI detector incorporated in Product Number HLC-8220 GPC
Column: Product Number TSKgel GMH$_{XL}$ (made by TOSOH CORPORATION) three Mobile Phase: tetrahydrofuran
Column Flow Amount: 0.5 mL/min.
Injection Amount: 20 μL
Measurement Temperature: 40° C.
Standard Polystyrene Molecular Weight: 1250, 3250, 9200, 28500, 68000, 165000, 475000, 950000, 1900000

<Viscosity>

Viscosity of samples at 25° C. was measured by using a cone-plate viscometer based on JIS K 5600-2-3: 1999.

<Hydroxyl Group Value>

Hydroxyl group values of samples were measured based on the B method (phthalation) in JIS K 1557-1 (2007).

Synthesis of Compound "a"

Synthesis Example A-1

Methylethyl ketone (hereinafter, MEK) as a solvent in an amount of 233 parts was put in a reaction container and the temperature was raised to 85° C. On the other hand, a monomer composition composed of 90 parts of methyl methacrylate and 10 parts of 2-hydroxyethyl acrylate was mixed and agitated with 4 parts of azobis-2-methylbutyronitrile (ABN-E made by Japan Hydrazine Co., Inc.) as a polymerization catalyst, so that a monomer mixed liquid was prepared. Subsequently, the monomer mixed liquid was dropped into the solvent explained above at 85° over two hours and the result after finishing dropping was matured for 4 hours so as to obtain a solution of compound "a" (solid content 30%). Note that the compound "a" is an example of compound A of the present invention.

Mw in the obtained compound "a" was 18000, Mn was 9500, Tg was 88° C., viscosity (25° C.) was 7 mPa·s and hydroxyl value was 17 mgKOH/g. Note that the Mw, Mn, viscosity and hydroxyl value were obtained by the methods explained above. The glass transition temperature was calculated by the Fox equation.

Synthesis of Prepolymer

Synthesis Example B-1

As a solvent, 223 parts of MEK was put in a reaction container and the temperature was raised to 80° C. Then, 15 parts of compound "b", 30 parts compound "c" and a mixture of compound "d" and compound "d1" in an amount of 55 parts (equivalent ratio of NCO/OH 2.9) were put in the reaction container and, furthermore, 0.1 part of dimethyl tin dilaurate as a catalyst and 0.05 part of p-methoxyphenol as a polymerization inhibitor were added and mixed at 80° C. for 3 hours.

Note that hexamethylene diisocyanate was used as compound "b", market-available EPAN U-105 (polyoxyethylene polyoxypropylene glycol (Mn: 6400) made by DAI-ICHI KOGYO SEIYAKU CO., LTD.) was used as component "c", and as a mixture of compound "d" and compound "d1", market-available ARONIX M-403 (photopolymerizable compound: mixture of dipentaerythritol pentaacrylate and dipentaerythritol hexaacrylate (pentaerythritol pentaacrylate content rate 50 to 60%) made by TOAGOSEI CO., LTD.) was used. Note that the compounds "b", "c", "d" and "d1" are examples of compounds B, C, D and D1 of the present invention, respectively.

Thereby, a solution (solid content 30%) of a prepolymer (a reaction product of compounds "b", "c", "d" and "d1") having both an isocyanate group and photopolymerizable group at molecular ends was obtained.

The obtained prepolymer had Mw of 12000, Mn of 4000 and viscosity (25° C.) of 7 mPa·s. Note that Mw, Mn and viscosity of the obtained prepolymer were obtained by the methods explained above.

Preparation of Coating Material

Synthesis Example C-1

A solution of compound "a" obtained in the synthesis example A-1 in an amount of 20 parts and a solution of prepolymer obtained in the synthesis example B-1 in an amount of 80 parts were put in a reaction container, and 0.1 part of dimethyltin dilaurate as a catalyst and 0.05 part of p-methoxyphenol as a polymerization inhibitor were furthermore added and mixed at 80° C. for 3 hours, thereby, a coating material solution (solid content 30%) was obtained. Mw in the obtained coating material was 19000, Mn was 6000 and viscosity (25° C.) was 7 mPa·s. Note that the Mw, Mn and viscosity were obtained by the methods explained above.

Synthesis Example C-2

A solution of compound "a" obtained in the synthesis example A-1 in an amount of 40 parts and a solution of prepolymer obtained in the synthesis example B-1 in an amount of 60 parts were put in a reaction container, and 0.1 part of dimethyltin dilaurate as a catalyst and 0.05 part of p-methoxyphenol as a polymerization inhibitor were furthermore added and mixed at 80° C. for 3 hours, thereby, a coating material solution (solid content 30%) was obtained. Mw in the obtained coating material was 19000, Mn was 8000 and viscosity (25° C.) was 7 mPa·s. Note that the Mw, Mn and viscosity were obtained by the methods explained above.

Example 1

Preparation of Curable Composition

Components shown below were mixed and agitated to prepare a curable composition.

| | |
|---|---|
| Coating Material Solution (solid content 30%) obtained in Synthesis Example C-1 (coating material solid content: 2 parts) | 6.67 parts |
| Ionizing Radiation Curable Resin (solid content 80%) (UNIDIC 17-813: urethane acrylate made by DIC Corporation) (urethane acrylate solid content: 98 parts) | 122.5 parts |
| Photopolymerization Initiator (1-hydroxy-cyclohexyl-phenyl-ketone) (IRGACURE 184 made by Ciba Japan K. K.) | 3 parts |
| Dilution Solvent (butyl acetate) | 200 parts |

[Manufacture of Surface Protective Sheet]

One surface of a transparent polyester film having a thickness of 125 μm (COSMOSHINE A4350: TOYOBO CO., Ltd.) was applied with a curable composition by a bar coating method in a way that a thickness after drying becomes 5 μm, dried at 90° C. for 90 seconds, then, an ultraviolet ray was irradiated to cure the curable composition so as to form a protective film. Thereby, a surface protective sheet was obtained.

Example 2

Other than changing an adding amount of the coating material solution to 16.67 parts (solid content 5 parts) and an adding amount of the ionizing radiation curable resin to 118.75 parts (solid content 95 parts), a surface protective sheet was obtained in the same way as in example 1.

Example 3

Other than changing an adding amount of the coating material solution to 33.33 parts (solid content 10 parts) and an adding amount of the ionizing radiation curable resin to 112.5 parts (solid content 90 parts), a surface protective sheet was obtained in the same way as in example 1.

Example 4

Other than changing an adding amount of the coating material solution to 50 parts (solid content 15 parts) and an adding amount of the ionizing radiation curable resin to 106.25 parts (solid content 85 parts), a surface protective sheet was obtained in the same way as in example 1.

Example 5

Other than changing an adding amount of the coating material solution to 66.67 parts (solid content 20 parts) and an adding amount of the ionizing radiation curable resin to 100 parts (solid content 80 parts), a surface protective sheet was obtained in the same way as in example 1.

Example 6

Other than changing an adding amount of the coating material solution to 100 parts (solid content 30 parts) and an adding amount of the ionizing radiation curable resin to 87.5 parts (solid content 70 parts), a surface protective sheet was obtained in the same way as in example 1.

Example 7

Other than changing an adding amount of the coating material solution to 133.33 parts (solid content 40 parts) and an adding amount of the ionizing radiation curable resin to 75 parts (solid content 60 parts), a surface protective sheet was obtained in the same way as in example 1.

Example 8

Other than using the coating material solution (solid content 30%) obtained in synthesis example C-2 instead of the coating material solution obtained in synthesis example C-1, changing an adding amount thereof to 50 parts (solid content 15 parts) and changing an adding amount of the ionizing radiation curable resin to 106.25 parts (solid content 85 parts), a surface protective sheet was obtained in the same way as in example 1.

Example 9

Other than using the ionizing radiation curable resin (product name, UV 7600BA: urethane acrylate made by The Nippon Synthetic Chemical Industry Co., Ltd. solid content 80%) instead of the ionizing radiation curable resin (UNIDIC 17-813), changing an adding amount thereof to 106.25 parts (solid content 85 parts) and changing an adding amount of the coating material solution to 50 parts (solid content 15 parts), a surface protective sheet was obtained in the same way as in example 1.

Example 10

Other than changing an adding amount of the coating material solution to 5 parts (solid content 1.5 parts) and an adding amount of the ionizing radiation curable resin to 123.13 parts (solid content 98.5 parts), a surface protective sheet was obtained in the same way as in example 1.

Example 11

Other than changing an adding amount of the coating material solution to 150 parts (solid content 45 parts) and an adding amount of the ionizing radiation curable resin to 68.75 parts (solid content 55 parts), a surface protective sheet was obtained in the same way as in example 1.

Comparable Example 1

Other than not adding any coating material and changing an adding amount of the ionizing radiation curable resin to 125 parts (solid content 100 parts), a surface protective sheet was obtained in the same way as in example 1.

Comparable Example 2

Other than preparing a curable composition (non-fluorine-based surface protective film application liquid) by mixing and agitating the components shown below and using the obtained curable composition (non-fluorine-based surface protective film application liquid), a surface protective sheet was obtained in the same way as in example 1.

<Non-Fluorine-Based Surface Protective Film Application Liquid>

| | |
|---|---|
| Ionizing Radiation Curable Resin (solid content 100%) (BEAMSET 575: Arakawa Chemical Industries, Ltd.) | 100 parts |
| Photopolymerizable Monomer (Isocyanuric Acid Triacrylate of 3 moles of Ethyleneoxide and 2 moles of ε-Caprolactone Adduct) (NK Ester A9300: Shin-Nakamura Chemical Co., Ltd., solid content 100%) | 3 parts |
| Photopolymerization Initiator (IRGACURE 184) | 0.4 part |
| Dilution Solvent (butyl acetate) | 200 parts |

Comparative Example 3

Other than preparing a curable composition (fluorine-based surface protective film application liquid) by mixing and agitating the components shown below and using the obtained curable composition (fluorine-based surface protective film application liquid), a surface protective sheet was obtained in the same way as in example 1.

<Fluorine-Based Surface Protective Film Application Liquid>

| | |
|---|---|
| Ionizing Radiation Curable Resin (UNIDIC 17-813) (urethane acrylate: 98 parts) | 122.5 parts |
| Photopolymerization Initiator (IRGACURE 184) | 3 parts |

-continued

| | |
|---|---|
| Fluorine-based additive (MEGAFACE RS-75 made by DIC Corporation) | 2.5 parts |
| Dilution Solvent (butyl acetate) | 200 parts |

[Evaluation]

The surface protective sheets obtained in the respective examples were evaluated on the items below. The results are shown in Table 1.

(1-1) Fingerprints Preventing Properties/Visibility

A ball of finger was pressed against a surface of the protective film to attach a fingerprint, then, the fingerprint-attached surface protective sheet was placed on a black paper and the fingerprint was observed from straight above the protective film side under a three band fluorescent light. The results were evaluated as "○" for those with almost no fingerprint observed and "×" for those with clear fingerprint observed.

(1-2) Fingerprints Prevention Properties/Wiping Properties

A ball of finger was pressed against a surface of the protective film to attach a fingerprint, then, a tissue (Kleenex: made by Nippon Paper Crecia Co., Ltd.) was brought to contact with the fingerprint-attached protective film and moved back and forth for 10 times with a load of 500 g per about 2 cm² to wipe off the fingerprint. Next, the surface protective sheet after wiping off the fingerprint was placed on a black paper, and the state after wiping off the fingerprint of the protective film was observed under a three band fluorescent light. The results were evaluated as "○" for those with no visible fingerprint, "Δ" for those with a wiped mark remained slightly and "×" for those with a clear wiped mark remained.

(2) Sliding Properties

Figure 4:
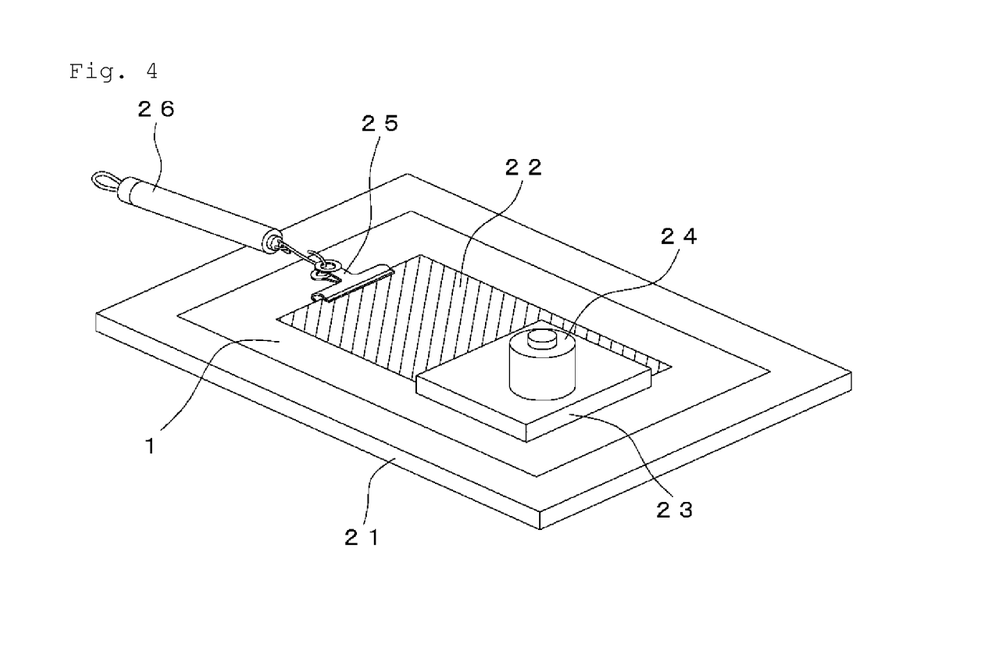
FIG. 4 is a schematic view showing a method of evaluating sliding properties.

As shown in FIG. 4, the surface protective sheet 1 was placed on a glass plate 21 in a way that the protective film 3 faces upward and a synthetic leather 22 in a size of 7 cm×12 cm was placed on the surface protective sheet 1 in a way that the protective film-side of the surface protective sheet 1 faces the leather-textured side of the synthetic leather 22. Next, on one end portion of the synthetic leather 22, a 6.5 cm square glass plate 23 having a thickness of 2 mm or so was placed, and 1 kg weight 24 was placed on the glass plate 23. Subsequently, the other end portion of the synthetic leather 22 was attached with a bulldog clip 25, and a hook of a spring scale 26 was hooked on a hole of the bulldog clip 25. Then, the spring scale 26 was pulled to measure a load at the moment that the synthetic leather 22 started to move on the protective film 3. The results were evaluated as "⊚" for those with a load of less than 400 g, "○" for those with 400 g or more and less than 500 g, "Δ" for those with 500 g or more and less than 600 g and "×" for those with 600 g or more.

(3) Scratch Resistance

A pencil scratch value on the protective film surface was measured by a method based on JIS-K5600-5-4 (1999). The obtained measurement values were evaluated as "○" for those exhibited 2H or more and "Δ" for those exhibited H.

TABLE 1

| | Curable Composition | | | | | | Evaluation | | | |
|---|---|---|---|---|---|---|---|---|---|---|
| | Coating Material | | | Curable Resin | | | Fingerprint | | | |
| | | Mixing Ratio (part by mass) | | | Mixing Ratio (part by mass) | | Preventing Properties | | | |
| | Kind | 30% Solution | Solid Content | Kind | 80% Solution | Solid Content | Visibility | Wiping Properties | Sliding Properties | Scratch Resistance |
| Example 1 | C-1 | 6.67 | 2.00 | UNIDIC 17-813 | 122.50 | 98.00 | ○ | Δ | Δ | ○ |
| Example 2 | C-1 | 16.67 | 5.00 | UNIDIC 17-813 | 118.75 | 95.00 | ○ | ○ | ○ | ○ |
| Example 3 | C-1 | 33.33 | 10.00 | UNIDIC 17-813 | 112.50 | 90.00 | ○ | ○ | ⊚ | ○ |
| Example 4 | C-1 | 50.00 | 15.00 | UNIDIC 17-813 | 106.25 | 85.00 | ○ | ○ | ⊚ | ○ |
| Example 5 | C-1 | 66.67 | 20.00 | UNIDIC 17-813 | 100.00 | 80.00 | ○ | ○ | ⊚ | ○ |
| Example 6 | C-1 | 100.00 | 30.00 | UNIDIC 17-813 | 87.50 | 70.00 | ○ | ○ | ⊚ | ○ |
| Example 7 | C-1 | 133.33 | 40.00 | UNIDIC 17-813 | 75.00 | 60.00 | ○ | ○ | ⊚ | Δ |
| Example 8 | C-2 | 50.00 | 15.00 | UNIDIC 17-813 | 106.25 | 85.00 | ○ | ○ | ⊚ | ○ |
| Example 9 | C-1 | 50.00 | 15.00 | UV 7600BA | 106.25 | 85.00 | ○ | ○ | ⊚ | ○ |
| Example 10 | C-1 | 5.00 | 1.50 | UNIDIC 17-813 | 123.13 | 98.50 | ○ | Δ | Δ | ○ |
| Example 11 | C-1 | 150.00 | 45.00 | UNIDIC 17-813 | 68.75 | 55.00 | ○ | ○ | ⊚ | Δ |
| Comparative Example 1 | — | | | UNIDIC 17-813 | 125.00 | 100.00 | ○ | X | X | ○ |
| Comparative Example 2 | Non-Fluorine-Based Surface Protective Film Application Liquid | | | | | | ○ | Δ | X | ○ |
| Comparative Example 3 | Fluorine-Based Surface Protective Film Application Liquid | | | | | | X | X | ⊚ | ○ |

As shown in Table 1, surface protective sheets of the examples 1 to 11 were confirmed to be superior in balancing fingerprint preventing properties and sliding properties to surface protective sheets in comparative examples 1 to 3. Particularly, surface protective sheets of examples 3 to 6, 8 and 9 exhibited extremely excellent balance of fingerprint preventing properties and sliding properties, and the scratch resistance of the coating films was also satisfactory since a coating material and curable resin were mixed in an optimal range.

The surface protective film of the comparative example 1 does not include any coating material. Therefore, the fingerprint preventing properties and sliding properties were not satisfactory.

The comparative example 2 is a fingerprint preventing film of related art. Although visibility and wiping properties thereof were satisfactory, sliding properties were not satisfactory.

The comparative example 3 is a so-called antifouling film using a fluorine-based additive. Because fluorine is included, sliding properties were excellent while attached fingerprints were noticeable because fingerprint components were repelled and the fingerprints only spread when trying to wipe them off, so that wiping properties were poor.

Note that values of a contact angle with water and that with hexadecane on the protective film surfaces of the surface protective sheets of examples 1 to 11 were measured by a method based on JIS-R3257 (1999). The results were confirmed that contact angles with water were in a range of 40 to 80 degrees and those with hexadecane were 30 degrees or less.

Also, wet tension on the protective film surfaces of the surface protective sheets of examples 1 to 11 was measured by a method based on JIS-K6768. The results were confirmed that the wet tension was 31 to 37 mN/m on all sheets.

The invention claimed is:

1. A surface protective sheet having a protective film on a surface of a substrate, wherein
   the protective film is formed from a curable composition that is a mixture of at least a coating material and a curable resin, and
   the coating material is formed from a reaction product of at least compounds A, B, C and D, wherein:
   Compound A is an acrylic polymer having a hydroxyl group in a side chain thereof, having a glass transition temperature of 23° C. or higher, having a hydroxyl number of 5 to 70mgKOH/g and formed from a monomeric composition comprising 70 mass % or more of a (meth)acrylic acid alkyl ester;
   Compound B is a diisocyanate;
   Compound C is a polyether polyol; and
   Compound D is a photopolymerizable compound having both a hydroxyl group and a photopolymerizable group.

2. The surface protective sheet according to claim 1, wherein the amount of the coating material is in a range of 2 parts by mass to 40 parts by mass, and the amount of the curable resin is in a range of 60 parts by mass to 98 parts by mass, when the total amount of the coating material and the curable resin is 100 parts by mass.

3. The surface protective sheet according to claim 1, wherein the curable resin is an ionizing radiation curable resin.

4. The surface protective sheet according to claim 2, wherein the curable resin is an ionizing radiation curable resin.

5. An electronic device, comprising an electronic device body and the surface protective sheet according to claim 1.

6. The electronic device according to claim 5, wherein the electronic device body is an electrostatic capacitance touch panel.

7. An electronic device component, wherein the surface protective sheet according to claim 1 is integrally formed on a surface of a component body composing an electronic device.

8. An electronic device, comprising an electronic device body and the surface protective sheet according to claim 2.

9. The electronic device according to claim 8, wherein the electronic device body is an electrostatic capacitance touch panel.

10. An electronic device component, wherein the surface protective sheet according to claim 2 is integrally formed on a surface of a component body composing an electronic device.

11. An electronic device, comprising an electronic device body and the surface protective sheet according to claim 3.

12. The electronic device according to claim 11, wherein the electronic device body is an electrostatic capacitance touch panel.

13. A method of manufacturing an electronic device component comprising:
   (i) contacting the surface protective sheet according to claim 1 with a component body comprising an electronic device in a way that a protective film of the surface protective sheet faces thereto, and thereafter
   (ii) removing a substrate of the surface protective sheet so as to form a protective film on a surface of the component body.

14. The method of manufacturing an electronic device component according to claim 13, wherein the electronic device is an electrostatic capacitance touch panel.

15. A method of manufacturing an electronic device component comprising:
   molding the surface protective sheet according to claim 1 in contact with a surface of a component body comprising an electronic device so as to form a protective film on the surface of the component body.

16. The method of manufacturing an electronic device component according to claim 15, wherein the electronic device is an electrostatic capacitance touch panel.

17. A method of manufacturing an electronic device component comprising:
   (i) contacting the surface protective sheet according to claim 2 with a component body comprising an electronic device in a way that a protective film of the surface protective sheet faces thereto, and thereafter
   (ii) removing a substrate of the surface protective sheet so as to form a protective film on a surface of the component body.

18. A method of manufacturing an electronic device component comprising:
   molding the surface protective sheet according to claim 2 in contact with a surface of a component body comprising an electronic device so as to form a protective film on the surface of the component body.

19. A method of manufacturing an electronic device component comprising:
   (i) contacting the surface protective sheet according to claim 3 with a component body comprising an electronic device in a way that a protective film of the surface protective sheet faces thereto, and thereafter
   (ii) removing a substrate of the surface protective sheet so as to form a protective film on a surface of the component body.

20. A method of manufacturing an electronic device component comprising:
   molding the surface protective sheet according to claim 3 in contact with a surface of a component body comprising an electronic device so as to form a protective film on the surface of the component body.

* * * * *